(12) United States Patent
Kim et al.

(10) Patent No.: US 10,692,833 B2
(45) Date of Patent: Jun. 23, 2020

(54) APPARATUS FOR CORRECTING A PARALLELISM BETWEEN A BONDING HEAD AND A STAGE, AND A CHIP BONDER INCLUDING THE SAME

(71) Applicant: SAMSUNG ELECTRONICS CO., LTD., Suwon-si, Gyeonggi-Do (KR)

(72) Inventors: Jae-Cheol Kim, Cheonan-si (KR); Gil-Man Kang, Cheonan-si (KR); Kyoung-Bok Cho, Cheonan-si (KR); Yong-Dae Ha, Asan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 294 days.

(21) Appl. No.: 15/463,061

(22) Filed: Mar. 20, 2017

(65) Prior Publication Data

US 2018/0102340 A1   Apr. 12, 2018

(30) Foreign Application Priority Data

Oct. 12, 2016 (KR) .......................... 10-2016-0132112

(51) Int. Cl.
 *H01L 21/00* (2006.01)
 *H01L 23/00* (2006.01)
(52) U.S. Cl.
 CPC ...... *H01L 24/75* (2013.01); *H01L 2224/7592* (2013.01); *H01L 2224/75753* (2013.01); *H01L 2224/75823* (2013.01)

(58) Field of Classification Search
 CPC .. H05K 13/0015; H05K 13/046; H05K 13/08; H01L 2224/75753; H01L 2224/75823; H01L 2224/7592
 See application file for complete search history.

(56) References Cited

U.S. PATENT DOCUMENTS

| 4,611,397 | A | * | 9/1986 | Janisiewicz | ........ H05K 13/0015 29/834 |
| 4,683,654 | A | * | 8/1987 | Scholten | ................ B65G 47/91 29/740 |
| 4,941,255 | A | * | 7/1990 | Bull | .................... H01L 21/6835 156/235 |
| 5,313,401 | A | * | 5/1994 | Kasai | .................. H05K 13/021 700/160 |
| 6,193,132 | B1 | * | 2/2001 | Shibata | .................... B23K 3/04 228/103 |

(Continued)

FOREIGN PATENT DOCUMENTS

| KR | 10-0979236 | 8/2010 |
| KR | 10-1126762 | 3/2012 |

(Continued)

*Primary Examiner* — Peter Dungba Vo
*Assistant Examiner* — Jeffrey T Carley
(74) *Attorney, Agent, or Firm* — F. Chau & Associates, LLC

(57) ABSTRACT

A bonding apparatus includes a detecting unit configured to determine whether a bonding head and a stage, on which a package substrate is disposed, are sufficiently parallel to each other during a bonding process, wherein the bonding head is configured to bond a semiconductor chip to the package substrate, and a correcting unit configured to adjust at least one of the bonding head or the stage based on the determination of the detecting unit during the bonding process.

13 Claims, 9 Drawing Sheets

(56) References Cited

U.S. PATENT DOCUMENTS

| | | | |
|---|---|---|---|
| 6,473,188 B1* | 10/2002 | Kim | H05K 13/0812 356/621 |
| 8,049,525 B2 | 11/2011 | Yamada et al. | |
| 8,528,802 B2 | 9/2013 | Yu et al. | |
| 9,136,243 B2* | 9/2015 | Schmidt-Lange | B23K 1/0016 |
| 9,161,457 B2 | 10/2015 | Lee et al. | |
| 2002/0083579 A1* | 7/2002 | Suhara | H05K 13/0411 29/739 |
| 2006/0048383 A1* | 3/2006 | Nishiwaki | H05K 3/0008 29/833 |
| 2006/0054283 A1 | 3/2006 | Yamauchi | |
| 2006/0099809 A1* | 5/2006 | Kainuma | H01L 21/563 438/685 |
| 2006/0125112 A1* | 6/2006 | Ikeya | B23K 20/007 257/778 |
| 2007/0215673 A1* | 9/2007 | Yoshimoto | H01L 21/67144 228/101 |
| 2009/0020229 A1* | 1/2009 | Yoon | H01L 21/6838 156/350 |
| 2009/0127315 A1* | 5/2009 | Okita | H01L 24/75 228/102 |
| 2012/0262626 A1* | 10/2012 | Ikeda | H05K 13/0015 348/373 |
| 2014/0030052 A1* | 1/2014 | Kostner | B25J 17/0208 414/749.6 |
| 2014/0071580 A1* | 3/2014 | Higginson | B81C 99/002 361/234 |
| 2014/0241843 A1* | 8/2014 | Golda | B25J 15/0085 414/751.1 |
| 2015/0083786 A1* | 3/2015 | Okamoto | H01L 21/67092 228/102 |

FOREIGN PATENT DOCUMENTS

| | | |
|---|---|---|
| KR | 10-1150572 | 6/2012 |
| KR | 10-1165030 | 7/2012 |

\* cited by examiner

APPARATUS FOR CORRECTING A PARALLELISM BETWEEN A BONDING HEAD AND A STAGE, AND A CHIP BONDER INCLUDING THE SAME

CROSS-REFERENCE TO RELATED APPLICATION

This application claims priority under 35 U.S.C. § 119 to Korean Patent Application No. 10-2016-0132112, filed on Oct. 12, 2016, in the Korean Intellectual Property Office (KIPO), the disclosure of which is incorporated by reference herein in its entirety.

TECHNICAL FIELD

The inventive concept relates to a bonding head. More particularly, the inventive concept relates to an apparatus for correcting a parallelism between a bonding head and a stage and a chip bonder including the same.

DISCUSSION OF THE RELATED ART

Generally, a chip bonder may include a stage and a bonding head. A package substrate may be placed on the stage. The bonding head may be configured to bond a semiconductor chip to the package substrate on the stage. To accurately bond the semiconductor chip with the package substrate, the bonding head and the stage should be arranged in parallel to each other.

One way of checking the parallelism between the bonding head and the stage (e.g., whether the bonding head and the stage are arranged in parallel to each other) may include measuring the heights of corners of a semiconductor chip after the semiconductor chip is bonded to the package substrate. In addition, a pressure sensitive paper can be used to detect whether the bonding head and the stage are not arranged in parallel with respect each other.

However, the deviation from a state of parallelism between the bonding head and the stage might not be accurately measured by using the pressure sensitive paper. In addition, since the state of parallelism between the bonding head and the stage may be verified after the bonding process, failures in the bonding process may be increased and a bonding time may also be increased.

SUMMARY

In an exemplary embodiment of the inventive concept, an apparatus can accurately measure the parallelism between a stage and a bonding head in real time during a bonding process. In addition, the apparatus can correct the deviation from parallelism.

According to an exemplary embodiment of the inventive concept, a bonding apparatus includes a detecting unit configured to determine whether a bonding head and a stage, on which a package substrate is disposed, are sufficiently parallel to each other during a bonding process, wherein the bonding head is configured to bond a semiconductor chip to the package substrate, and a correcting unit configured to adjust at least one of the bonding head or the stage based on the determination of the detecting unit during the bonding process.

According to an exemplary embodiment of the inventive concept, a chip bonder includes a stage including a package substrate disposed thereon, a bonding head disposed on the stage to bond a semiconductor chip to the package substrate, a detecting unit configured to determine whether the bonding head and the stage are sufficiently parallel to each other during a bonding process, and a correcting unit configured to move at least one of the bonding head or the stage based on the determination of the detecting unit during the bonding process.

According to an exemplary embodiment of the inventive concept, a bonding apparatus includes a stage configured to support a substrate thereon, and a bonding head configured to support a chip thereon. The bonding head is configured to press and bond the chip onto the substrate. The bonding head includes a detecting unit and a correcting unit. The detecting unit is configured to determine whether a surface of the chip and a surface of the substrate are sufficiently parallel to each other. The correcting unit is configured to move at least one of the bonding head or the substrate such that the surface of the chip and the surface of the substrate are aligned sufficiently parallel to each other, by using the determination of the detecting unit, when the bonding head is used bond the chip onto the substrate.

BRIEF DESCRIPTION OF THE DRAWINGS

The above and other features of the inventive concept will become more apparent by describing in detail exemplary embodiments thereof in conjunction with the accompanying drawings, in which.

DETAILED DESCRIPTION OF THE EMBODIMENTS

Hereinafter, exemplary embodiments of the inventive concept will be described in detail with reference to the accompanying drawings. When an element is described as being on another element, the element may be directly disposed on the other elements or intervening elements may be disposed therebetween.

Figure 1:
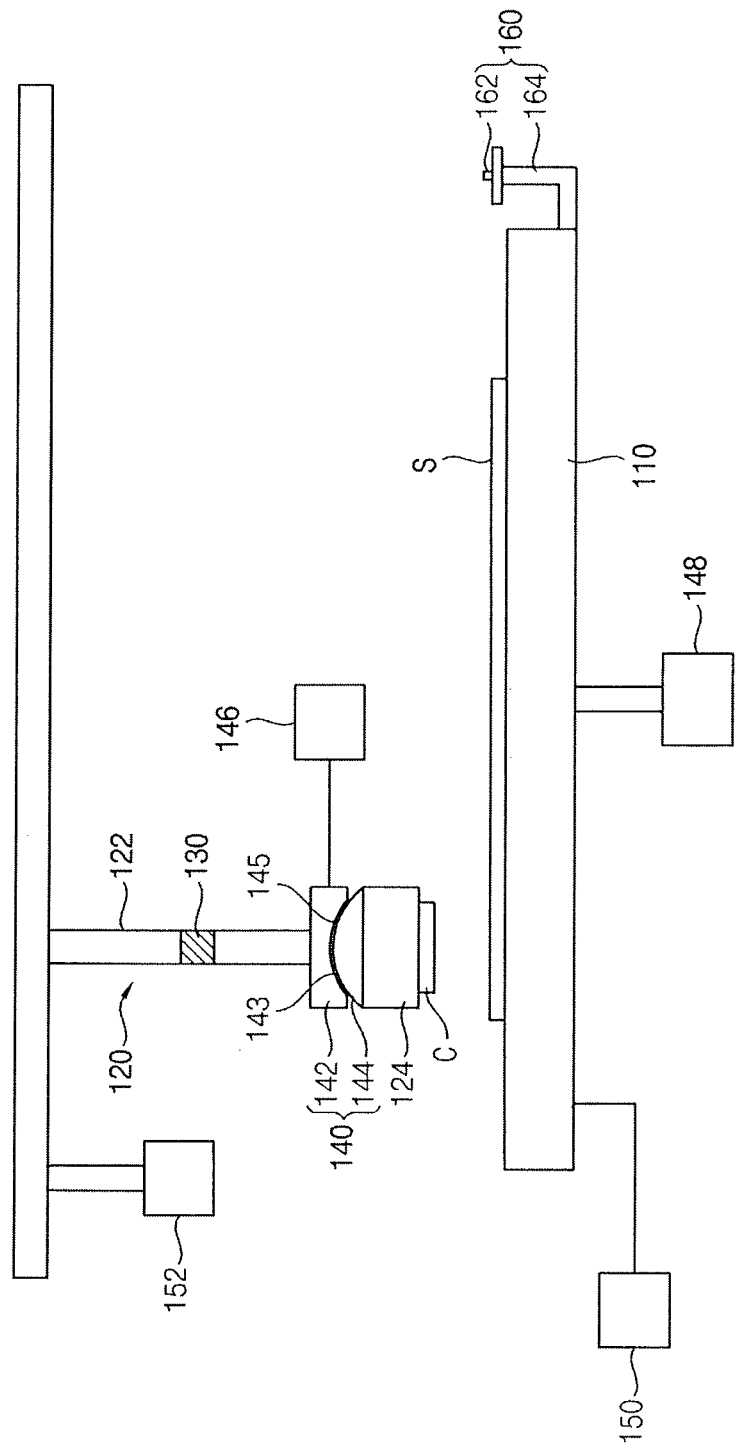
FIG. 1 is a cross-sectional view illustrating a chip bonder according to an exemplary embodiment of the inventive concept.

FIG. 1 is a cross-sectional view illustrating a chip bonder according to an exemplary embodiment of the inventive concept.

Referring to FIG. 1, a chip bonder may include a stage 110, a bonding head 120, a detecting unit 130 and a correcting unit 140.

The stage 110 may be configured to support a package substrate S. The package substrate S may be placed on an upper surface of the stage 110. The package substrate S may be fixed to the upper surface of the stage 110 by using vacuum, a mechanical fixing member, etc.

The bonding head 120 may be disposed over the stage 110. The bonding head 120 may include a bonding shaft 122 and a collet 124. The bonding shaft 122 may be lifted by a lifter. The collet 124 may be configured to hold a semiconductor chip C.

The detecting unit 130 may be configured to detect a parallelism between the bonding head 120 and the stage 110. The parallelism between the bonding head 120 and the stage 110 may refer to, for example, a state where a lower surface of the semiconductor chip C is parallel or substantially parallel to the package substrate S and/or the stage 110. The detecting unit 130 may detect the parallelism between the bonding head 120 and the stage 110 in real time during a bonding process. The detecting unit 130 may be attached to the bonding shaft 122.

For example, when the bonding head 120 is inclined with respect to the stage 110, a lateral load may be applied to the bonding head 120 when compressing the semiconductor chip C to the package substrate S. The detecting unit 130 may detect a lateral load applied to the bonding head 120, a lateral displacement of the bonding head 120 and/or a lateral strain of the bonding head 120. A lateral load, displacement or strain may indicate a load, displacement or strain applied in a direction that crosses the direction in which the bonding shaft 122 extends. The lateral load may cause a lateral displacement, strain changes, etc., of the bonding head 120. The parallelism between the bonding head 120 and the stage 110 may be determined to be abnormal based on the lateral load, the lateral displacement, the strain changes, etc., of the bonding head 120 detected by the detecting unit 130. The abnormal parallelism between the bonding head 120 and the stage 110 may refer to, for example, a state where a lower surface of the semiconductor chip C is not parallel or substantially parallel to the package substrate S and/or the stage 110. In this case, an angle formed between the lower surface of the semiconductor chip C and the package substrate S and/or the stage 110 is greater than a predetermined threshold angle.

In an exemplary embodiment of the inventive concept, the detecting unit 130 may include a load sensor, a displacement sensor, a strain sensor, etc. The load sensor may detect the lateral load applied to the bonding head 120. The displacement sensor may detect the lateral displacement of the bonding head 120. The strain sensor may detect the lateral strain of the bonding head 120.

Figure 2:
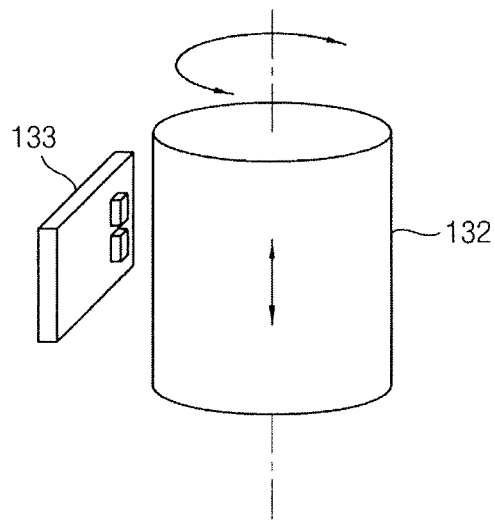
FIG. 2 is an enlarged perspective view illustrating an encoder of the chip bonder of FIG. 1, according to an exemplary embodiment of the inventive concept.
Figure 3:
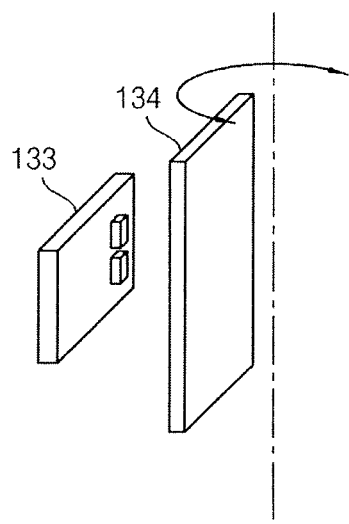
FIG. 3 is an enlarged perspective view illustrating an encoder of a chip bonder according to an exemplary embodiment of the inventive concept.

FIG. 2 is an enlarged perspective view illustrating an encoder of the chip bonder of FIG. 1, according to an exemplary embodiment of the inventive concept. FIG. 3 is an enlarged perspective view illustrating an encoder of a chip bonder according to an exemplary embodiment of the inventive concept. Instead of the load sensor, displacement sensor, strain sensor, etc, the detecting unit 130 may include an encoder. The encoder may be a cylindrical encoder 132, as shown in FIG. 2, a plate-type encoder 134, as shown in FIG. 3, or the like. The encoder 132/134 may be attached to the bonding shaft 122 to measure an inclination angle of the bonding shaft 122. For example, the encoder 132/134 may be used to measure an inclination angle of the bonding shaft 122 with respect to a vertical line or with respect to a direction in which the bonding shaft 122 extended before becoming inclined.

The correcting unit 140 may be configured to correct the bonding head 120 and/or the stage 110 based on the parallelism detected by the detecting unit 130. When the detecting unit 130 detects an abnormal parallelism (e.g., a state in which the bonding head 120 and the stage 110 are not substantially parallel) between the bonding head 120 and the stage 110, the correcting unit 140 may adjust positions of the bonding head 120 and/or the stage 110 during the bonding process to arrange the bonding head 120 and the stage 110 parallel or substantially parallel to each other. It is understood that "substantially parallel" is the state in which the bonding head 120 and the stage 110 are sufficiently parallel for the chip bonder to function properly.

The correcting unit 140 may include a first correcting block 142, a second correcting block 144, a vacuum-applying member 146 and a lifter 148. The first correcting block 142 may be installed at a lower end of the bonding shaft 122. The second correcting block 144 may be installed at an upper surface of the collet 124. The second correcting block 144 may be disposed between the first correcting block 142 and the collet 124. The second correcting block 144 may be connected with the first correcting block 142 in such a way the second correction block 144 can also slide or move with respect to the first correction block 142. Accordingly, the second correcting block 144 may be movably received in a housing to which the first correcting block 142 is fixed.

The vacuum-applying member 146 may be configured to supply vacuum force between the first correcting block 142 and the second correcting block 144. The lifter 148 may be configured to move the stage 110 upwardly such that the stage 110 or the package substrate S contacts the semiconductor chip C or the collet 124. In this case, the second correcting block 144 may be pressed against the first correcting block 142.

The first correcting block 142 may have a first correcting curved surface 143. The first correcting curved surface 143 may be formed at a lower surface of the first correcting block 142. The first correcting curved surface 143 may be a semi-circular groove formed at the lower surface of the first correcting block 142. For example, the first correcting curved surface 143 may be a concave surface facing the second correcting block 144.

The second correcting block 144 may have a second correcting curved surface 145. The second correcting curved surface 145 may be a semi-circular protrusion protruding upwardly from an upper surface of the second correcting block 144. For example, the second correcting curved surface 145 may be semi-circular. The second correcting curved surface 145 may have a curvature substantially the same as a curvature of the first correcting curved surface 143. In addition, the second correcting curved surface 145 may be a convex surface facing the first correcting curved surface 143. Thus, the semi-circular groove of the first correcting curved surface 143 may have a shape and size substantially the same as the shape and size of the semi-circular protrusion of second correcting curved surface 145.

FIGS. 4 to 8 are cross-sectional views illustrating operations of a correcting unit of the chip bonder of FIG. 1, according to an exemplary embodiment of the inventive concept.

Figure 4:
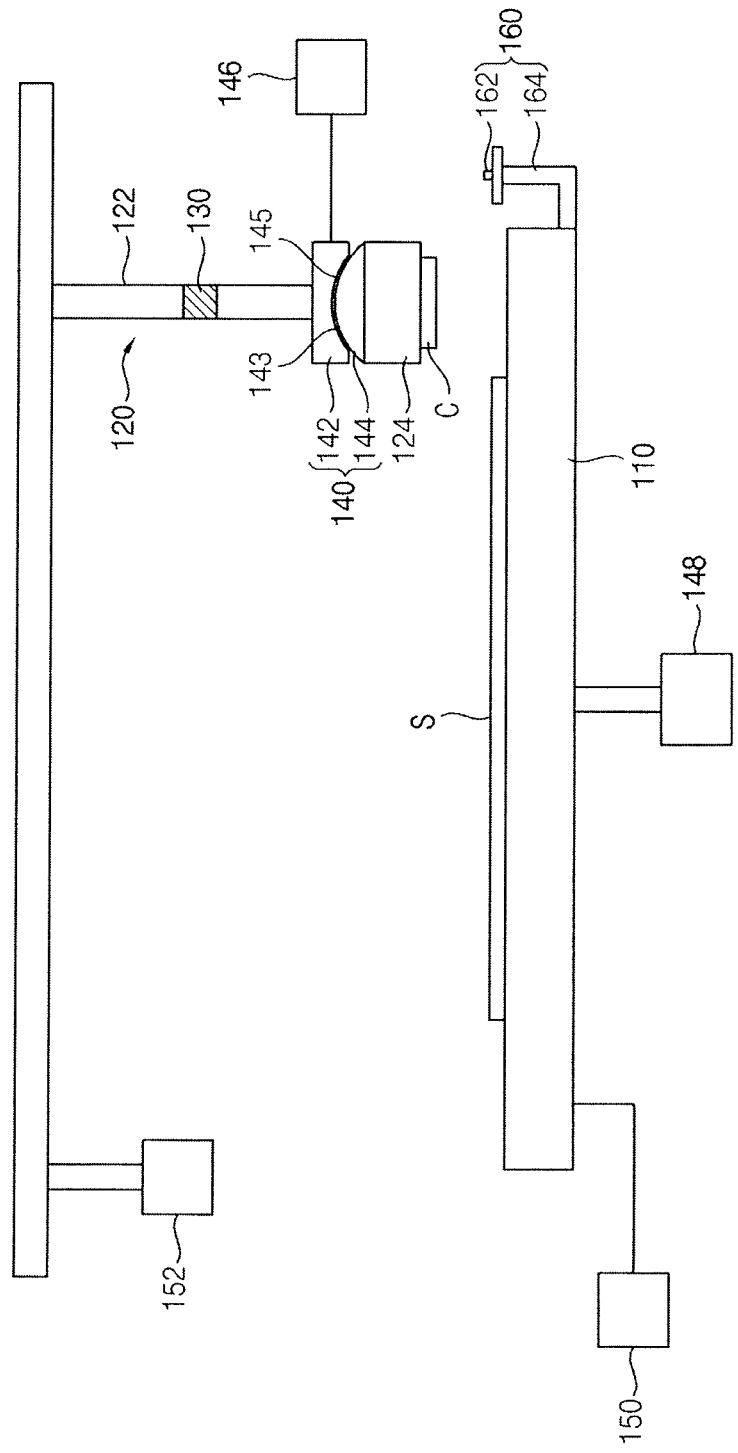
FIGS. 4 to 8 are cross-sectional views illustrating operations of a correcting unit of the chip bonder of FIG. 1, according to an exemplary embodiment of the inventive concept.

Referring to FIG. 4, the detecting unit 130 may detect an abnormal parallelism between the bonding head 120 and the stage 110. The bonding head 120 may be moved to an upper region over an edge portion of the stage 110. Because the bonding process may be performed, the package substrate S may be placed on the upper surface of the stage 110. Thus, the bonding head 120 may be moved to an edge portion of the stage 110 that does not overlap the package substrate S. In addition, the bonding head 120 may be separated from the stage 110, as shown in FIG. 4. The above-mentioned operation of the correcting unit 140 may be performed during the bonding process.

Figure 5:
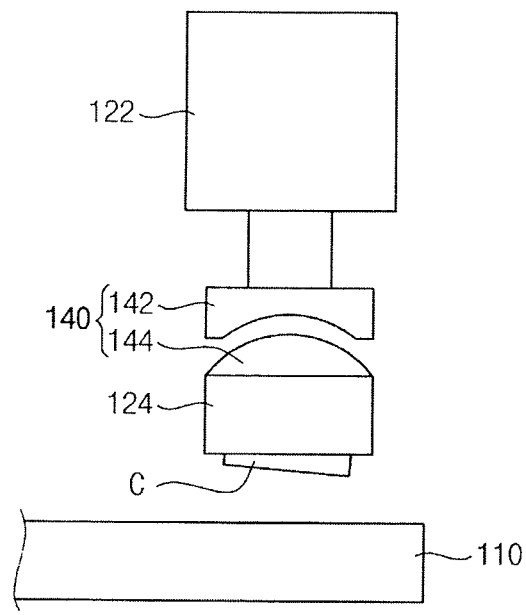

Referring to FIG. 5, the vacuum-applying member 146 may stop providing vacuum between the first and second correcting curved surfaces 143 and 145. Thus, the second correcting block 144 may be detached from the first correcting block 142 and be placed on the stage 110, as shown in FIG. 6.

Figure 6:
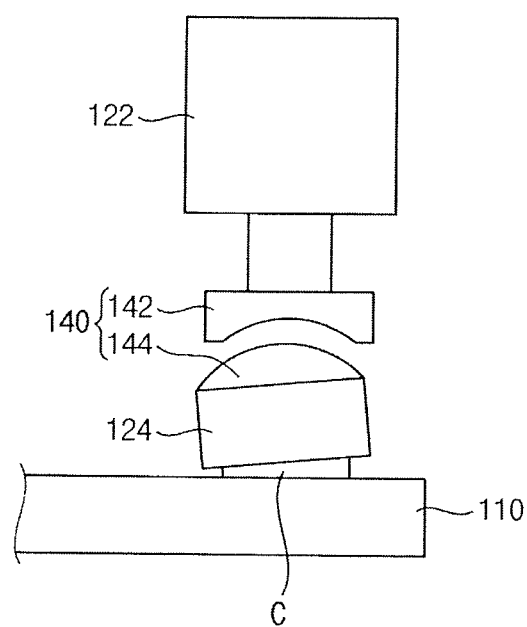

Referring to FIG. 6, the second correcting block 144 may be detached from the first correcting block 142, and the collet 124 may be free to move with respect to the second correcting block 144. Therefore, the originally-inclined semiconductor chip C may contact the horizontal upper surface of the stage 110 and be horizontally aligned (e.g., the lower surface of the semiconductor chip C may be aligned to be parallel to the horizontal upper surface of the stage 110). The horizontal alignment of the semiconductor chip C may cause the collet 124 to rotate with respect to the horizontal upper surface of the stage 110.

Figure 7:
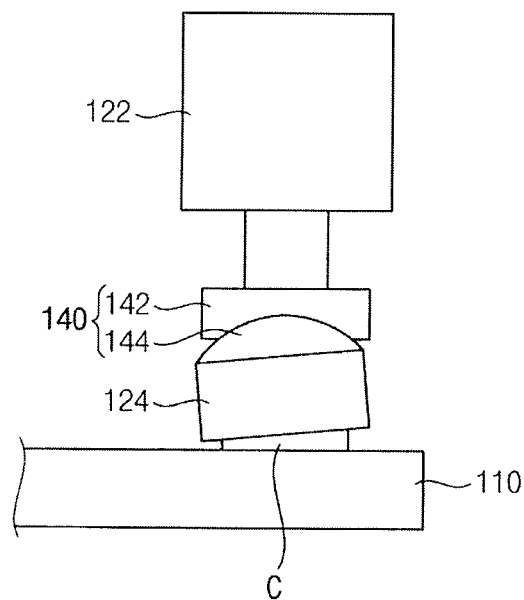

Referring to FIG. 7, the lifter 148 may move the second correcting block 144 upwardly such that the second correcting curved surface 145 may contact the first correcting curved surface 143 while the lower surface of the semiconductor chip C is aligned to be parallel to the horizontal upper surface of the stage 110. The vacuum-applying member 146 may provide vacuum force between the first and second correcting curved surfaces 143 and 145 to connect the first and second correcting blocks 142 and 144 to each other.

Figure 8:
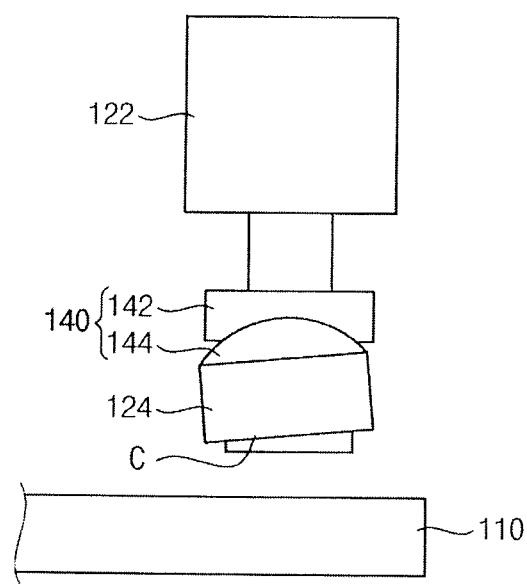

Referring to FIG. 8, the lifter 148 may move the stage 110 downwardly to separate the collet 124 and the semiconductor chip C from the stage 110. As stated above, the first and second correcting blocks 142 and 144 may be connected to each other by using the vacuum force. The collet 124 may be inclined with respect to the stage 110 and the semiconductor chip C may be parallel or substantially parallel to the stage 110, as shown in FIG. 8. It is understood that the above-described process may be used when the bottom surface of the semiconductor chip C is not sufficiently parallel with the stage 110 and/or the package substrate S to align the semiconductor chip C parallel to the stage 110 and/or the package substrate S, regardless of the alignment of the collet 124 with the stage 110 and/or the package substrate S.

The operations described above with reference to FIGS. 5 to 8 may also be performed when the semiconductor chip C is not disposed on the bottom surface of the collet 124 to align the collet 124 parallel to the stage 110. In this case, when it is detected that the bottom surface of the collet 124 is not parallel or substantially parallel to the stage 110, the first and second correcting blocks 142 and 144 may be separated from each other. Thus, the collet 124 may be disposed on the stage 110 and may be aligned to be parallel to the stage 110 by its own weight. Then, the first and second correcting blocks 142 and 144 may be reconnected by using, for example, the vacuum force as described above.

In addition, the abnormal parallelism may be caused by a foreign substance on the lower surface of the collet 124 and/or the upper surface of the stage 110. To detect the foreign substance, the correcting unit 140 may further include a first camera 150 and a second camera 152.

The first camera 150 may photograph the lower surface of the collet 124. Whether a foreign substance exists on the lower surface of the collet 124 may be detected by inspecting a photograph obtained by using the first camera 150. When a foreign substance exists on the lower surface of the collet 124, the collet 124 may be cleaned to remove the foreign substance.

The second camera 152 may photograph the upper surface of the stage 110. Whether a foreign substance exists on the upper surface of the stage 110 may be detected by inspecting a photograph obtained by using the second camera 152. When a foreign substance exists on the upper surface of the stage 110, the stage 110 may be cleaned to remove the foreign substance.

Referring to FIG. 1, the chip bonder may further include a checking unit 160. The checking unit 160 may be configured to check the parallelism between the bonding head 120 and the stage 110, as corrected by the correcting unit 140.

The checking unit 160 may include a load sensor 162 arranged at side surface of the stage 110. The load sensor 162 may be connected with the stage 110 through a bracket 164. Alternatively, the load sensor 162 may be disposed at another location that excludes the stage 110.

At least two points of the corrected lower surface of the bonding head 120, (e.g., the lower surface of the collet 124) may press the load sensor 162. In an exemplary embodiment of the inventive concept, four corners of the lower surface of the collet 124 may press the load sensor 162. When pressures of the four corners of the lower surface of the bonding head 120 measured by the load sensor 162 are substantially same or within an allowable/predetermined range, the bonding head 120 may be determined to be parallel to the stage 110. When the pressures of the four corners of the lower surface of the bonding head 120 measured by the load sensor 162 fall outside of the allowable/predetermined range, it may be determined that the bonding head 120 and the stage 110 are not parallel to each other.

Figure 9:
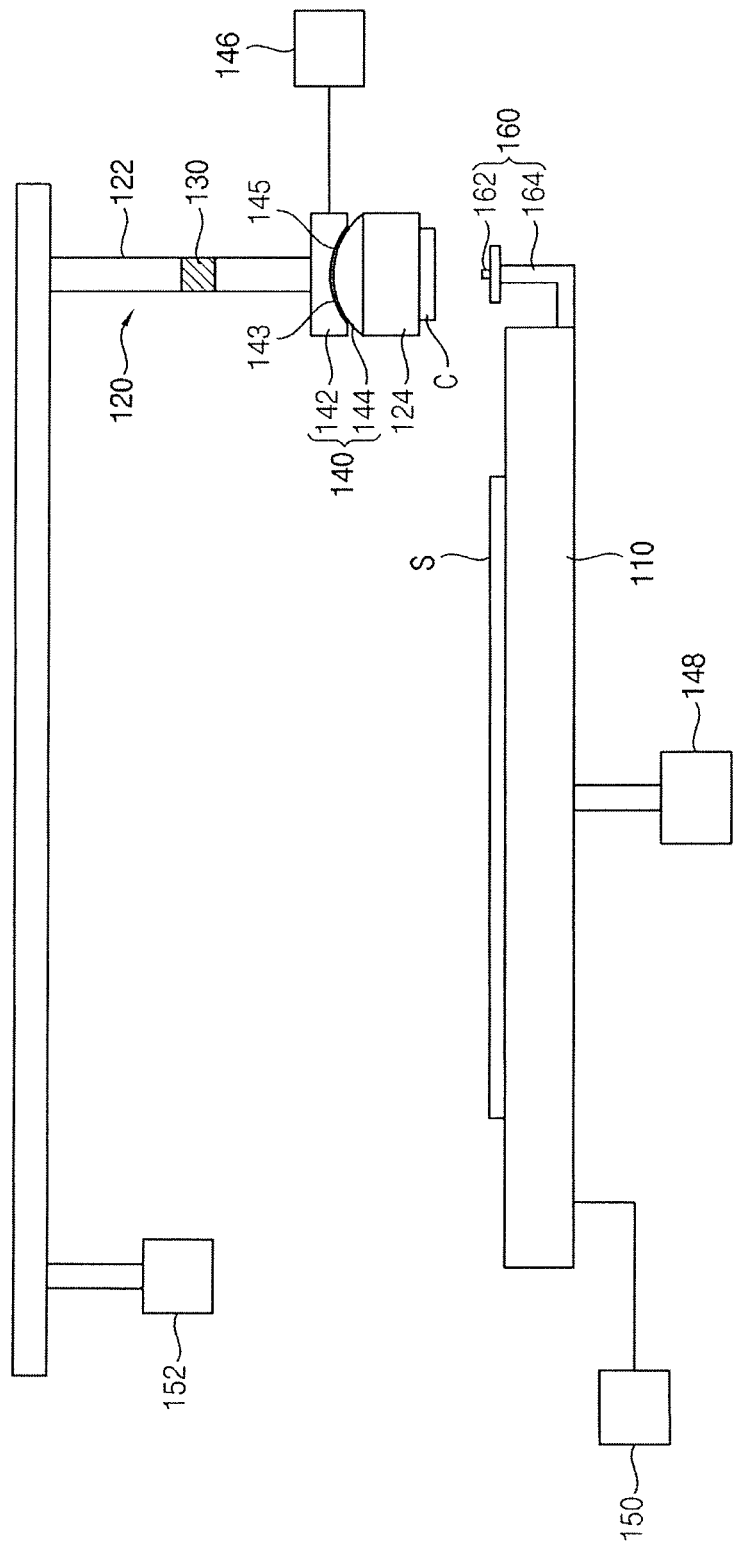
FIG. 9 is a cross-sectional view and FIGS. 10 to 13 are plan views illustrating operations of a checking unit of the chip bonder of FIG. 1, according to an exemplary embodiment of the inventive concept.

FIG. 9 is a cross-sectional view and FIGS. 10 to 13 are plan views illustrating operations of a checking unit of the chip bonder of FIG. 1, according to an exemplary embodiment of the inventive concept.

Referring to FIG. 9, the corrected bonding head 120 may be moved to the load sensor 162. The corrected bonding head 120 may refer to a bonding head 120 having the collet 124 and/or the semiconductor chip C arranged parallel to the stage 110 and/or the package substrate S. The corrected bonding head 120 may be positioned over the load sensor 162.

Figure 10:
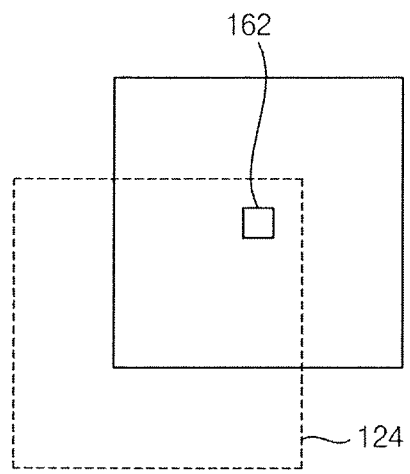

Referring to FIG. 10, the bonding shaft 122 may be moved downwardly. The upper right corner of the collet 124 may press the load sensor 162.

Figure 11:
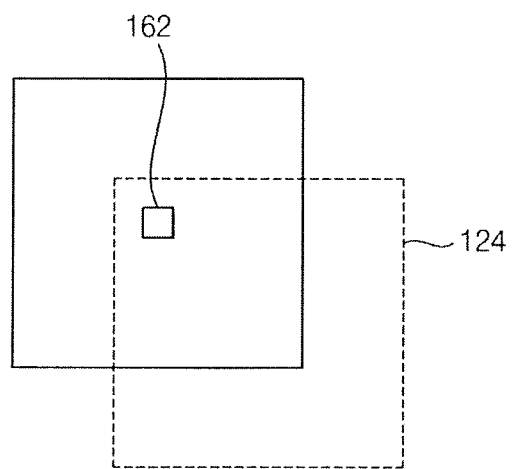

Referring to FIG. 11, the bonding shaft 122 may be moved downwardly. The upper left corner of the collet 124 may press the load sensor 162.

Figure 12:
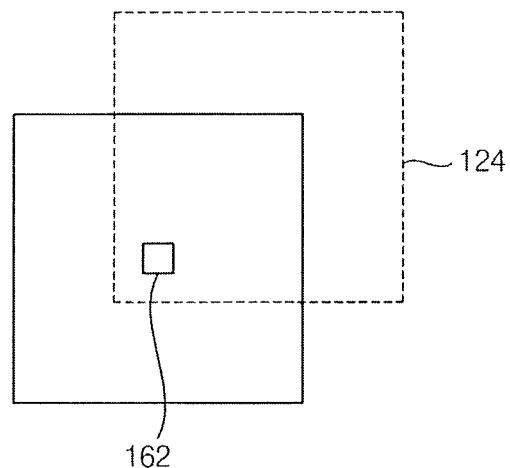

Referring to FIG. 12, the bonding shaft 122 may be moved downwardly. The lower left right corner of the collet 124 may press the load sensor 162.

Figure 13:
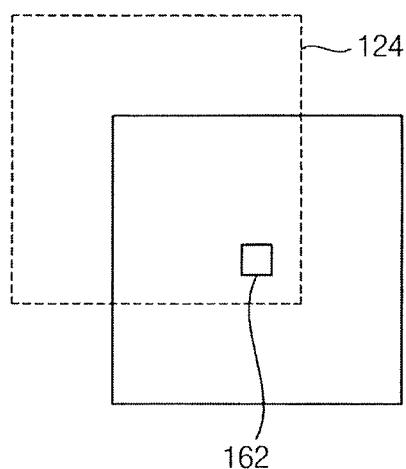

Referring to FIG. 13, the bonding shaft 122 may be moved downwardly. The lower right corner of the collet 124 may press the load sensor 162.

When the four pressures measured by the load sensor 162 are outside of the allowable/predetermined range, it is determined that the collet 124 might not be accurately corrected by the correcting unit 140. In this case, the correcting unit 140 may perform the above-mentioned processes again to correct the collet 124.

According to an exemplary embodiment of the inventive concept, when an abnormal parallelism is detected between the bonding head 120 and the stage 110, the abnormal parallelism may be corrected. For example, the parallelism between the bonding head 120 and the stage 110 may be corrected without stopping operations of the chip bonder. Thus, bonding failures caused by the abnormal bonding head 120 and/or the abnormal stage 110 may be reduced.

Figure 14:
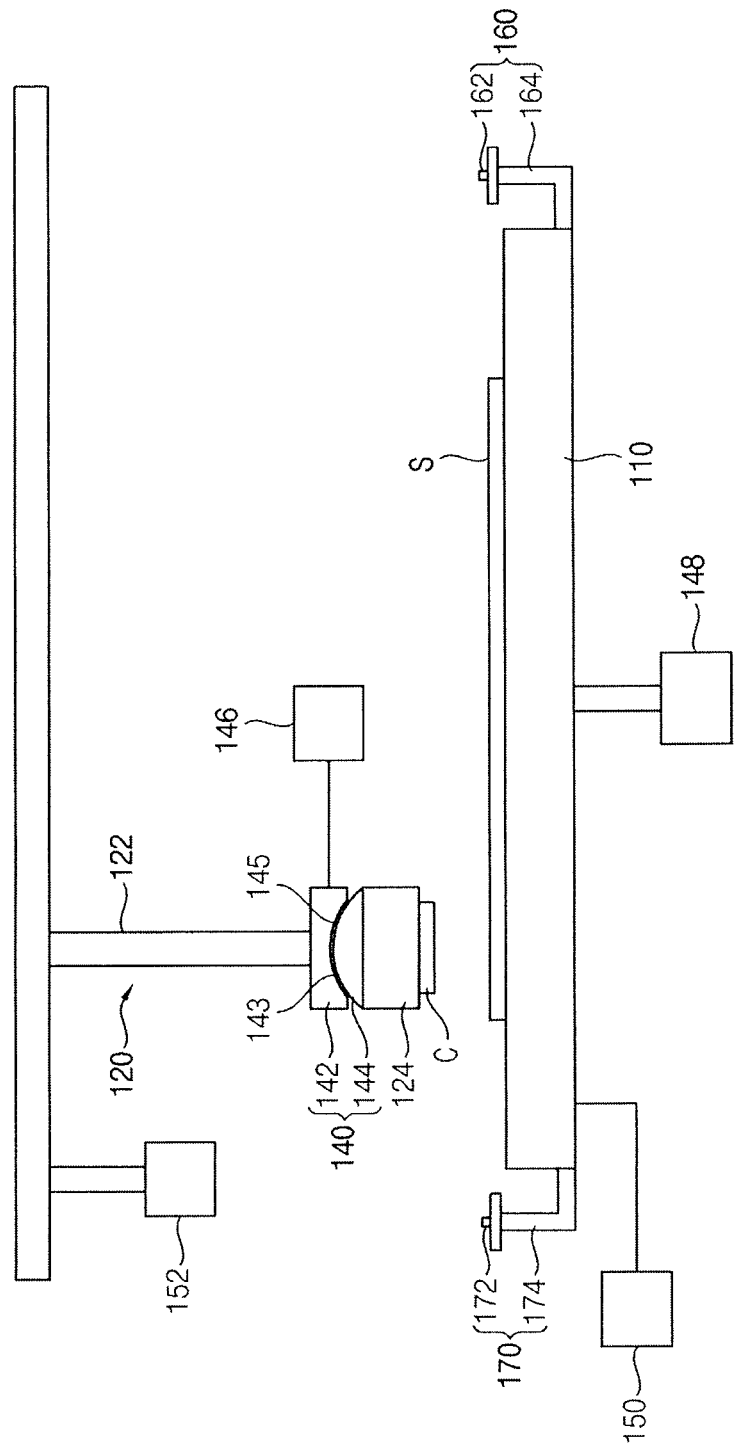
FIG. 14 is a cross-sectional view illustrating a chip bonder according to an exemplary embodiment of the inventive concept.

FIG. 14 is a cross-sectional view illustrating a chip bonder according to an exemplary embodiment of the inventive concept.

The chip bonder of FIG. 14 may include elements substantially the same as the elements of the chip bonder in FIG. 1, except for a detecting unit. Thus, a duplicate description of elements already described may be omitted for brevity.

Referring to FIG. 14, a detecting unit 170 may include a load cell 172 disposed at side of the stage 110. The load cell 172 may be connected with the stage 110 through a bracket 174. Alternatively, the load cell 172 may be disposed at another location that excludes the stage 110.

The bonding head 120 may be moved to a region over the load cell 172. The bonding head 120 may press the load cell 172. The load cell 172 may measure a load applied by the bonding head 120 to detect the parallelism between the bonding head 120 and the stage 110.

For example, when the bonding head 120 is inclined, the bonding head 120 may apply the load lower than a predetermined reference load to the load cell 172. The load cell 172 may compare the measured load with a reference load to detect the parallelism between the bonding head 120 and the stage 110.

The pressing of the bonding head 120 on the load cell 172 may be performed during the bonding process. Thus, the parallelism between the bonding head 120 and the stage 110 may be detected by using the load cell 172 during the bonding process.

According to an exemplary embodiment of the inventive concept, the detecting unit 170 may detect the parallelism between the bonding head 120 and the stage 110 in real-time during the bonding process. The correcting unit 140 may correct the bonding head 120 and/or the stage 110 in real time during the bonding process in accordance with the parallelism determined by using the detecting unit 170. Thus, a delay of a bonding time caused by the parallelism correction may be reduced or prevented. Further, bonding failures may be decreased.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A bonding apparatus, comprising:
a bonding head including a bonding shaft;
a collet attached to the bonding head;
a stage, wherein a package substrate is disposed on the stage;
a detector circuit that determines whether the collet and the stage are parallel to each other during a bonding process, wherein the bonding head is configured to bond a semiconductor chip to the package substrate; and
a correcting unit including a first correcting block and a second correcting block disposed on the first correcting block, wherein the first correcting block is attached to the bonding shaft and includes a first curved surface, wherein the second correcting block includes a second curved surface, wherein the collet is disposed on the second correcting block, wherein the correcting unit adjusts at least one of the collet or the stage based on the determination of the detector circuit during the bonding process, wherein, when it is determined that the collet and stage are not parallel to each other, the second correcting block is configured to detach, with the collet, from the first correcting block to be disposed on the stage and away from the package substrate, and then, to reattach, with the collet, to the first correcting block so as to be removed from the stage.

2. The apparatus of claim 1, wherein the detector circuit comprises a sensor attached to the bonding head and that detects a lateral load applied to the bonding head.

3. The apparatus of claim 1, wherein the detector circuit comprises a displacement sensor attached to the bonding head and that detects a lateral displacement of the bonding head.

4. The apparatus of claim 1, wherein the detector circuit comprises a strain sensor attached to the bonding head and that detects a lateral strain of the bonding head.

5. The apparatus of claim 1, wherein the detector circuit comprises an encoder attached to the bonding head to detect an inclination angle of the bonding head.

6. The apparatus of claim 1, Wherein the detector circuit comprises a load cell disposed under the bonding head and that detects a pressure of the bonding head.

7. The apparatus of claim 1, wherein
the second correcting block is installed at the collet,
wherein the collet is configured to hold the semiconductor chip and to be connected to the first correcting block, and
wherein the second surface of the correcting block is configured to engage with the first curved surface of the first correcting block.

8. The apparatus of claim 7, wherein the first curved surface is concave and is disposed at a lower surface of the first correcting block, the second curved surface is convex and is disposed at an upper surface of the second correcting block, and the second curved surface has a curvature substantially the same as a curvature of the first curved surface.

9. The apparatus of claim 7, wherein the correcting unit further comprises a lifter that moves the second curved surface upward toward the first curved surface such that the second curved surface contacts the first curved surface.

10. The apparatus of claim 7, wherein the correcting unit further comprises a vacuum-applying member that provides a vacuum force between the first curved surface and the second curved surface.

11. The apparatus of claim 7, wherein the correcting unit further comprises at least one camera that photographs at least one of the bonding head or the stage.

12. The apparatus of claim 7, further comprising a checking unit that checks whether the bonding head and the stage are sufficiently parallel to each other after the correcting unit is used to adjust at least one of the bonding head or the stage.

13. The apparatus of claim 12, wherein the checking unit further comprises a load sensor disposed on the stage, wherein the load sensor measures loads applied from at least two different areas of a lower surface of the bonding head.

* * * * *